United States Patent [19]

Ort

[11] 4,007,046

[45] Feb. 8, 1977

[54] METHOD OF TREATMENT OF OFFSET MASTERS PRIOR TO CONVERSION

[75] Inventor: George M. Ort, Arlington Heights, Ill.

[73] Assignee: A. B. Dick Company, Niles, Ill.

[22] Filed: Feb. 19, 1975

[21] Appl. No.: 550,974

[52] U.S. Cl. .................................... 96/33; 96/1 R; 96/1.8; 101/465; 252/62.1 R

[51] Int. Cl.[2] .......................................... G03F 7/02

[58] Field of Search ........................ 96/33, 1 R, 1.8; 101/465; 252/62.1

[56] References Cited

UNITED STATES PATENTS

| | | | |
|---|---|---|---|
| 3,445,229 | 5/1969 | Webers et al. | 96/28 |
| 3,672,885 | 6/1972 | Ort | 96/1.8 X |
| 3,717,464 | 2/1973 | Tandy | 96/33 |
| 3,758,330 | 9/1973 | Richman | 96/33 X |
| 3,886,865 | 6/1975 | Ohto et al. | 96/33 X |

*Primary Examiner*—Mayer Weinblatt
*Attorney, Agent, or Firm*—McDougall, Hersh & Scott

[57] ABSTRACT

Prior to conversion of an offset master imaged by electrostatic technique to render the non-imaged portions of the imaged master ink repellent and water receptive, the surface is pre-wet with an organic solvent system which leaves residual solvent on the surface at the time of conversion.

6 Claims, No Drawings

METHOD OF TREATMENT OF OFFSET MASTERS PRIOR TO CONVERSION

This invention relates to the preparation of offset masters by electrophotographic technique and it relates more particularly to the method for processing such imaged offset masters for use in multiple copy reproduction by lithographic technique.

As described in U.S. Pat. Nos. 3,445,229, 2,987,395 and 3,001,872, a master sheet is fabricated of a base sheet of metal, plastics, paper or the like having a photoconductive zinc oxide - resinous binder coating which has the desired photoconductive properties for the development of a latent electrostatic image by the now well known electrostatic technique. Such images, when developed by suitable liquid or powdered developers having an ink receptive, water repellent toner, are ink receptive and water repellent. However, because of the presence of the organic resinous binder, the non-imaged portions are not sufficiently ink repellent and water receptive and thus still require treatment of the imaged surface to convert the non-imaged portions of the master surface to the desired water receptive, ink repellent characteristics necessary for a workable offset master. Such solution for treatment has been referred to in the trade as a conversion solution. Suitable conversion solutions and their method of application onto the imaged offset master to effect the desired conversion of the non-imaged portions are described in U.S. Pat. Nos. 3,672,885 and 3,661,598.

It has been found that unless the imaged master is converted by the treatment of the surface immediately after imaging, voids tend to form in the solid areas of the copy produced — a phenomenon referred to by the skilled in the art as "blinding." This phenomenon is believed to result from penetration of the image by the conversion solution to cause over-conversion. This phenomenon of blinding is not prevalent in copy produced from imaged masters converted by a conversion solution immediately after imaging. This is believed to result from the retention of diluent in the imaged areas for a time greater than in the non-imaged areas thereby to militage against penetration of the conversion solution into the imaged areas.

Furthermore, it has been found that even when the offset master is converted by the application of a conversion solution immediately after image development by a liquid developer, the non-imaged areas tend, over a period of time, to revert to the original hydrophobic state thereby to produce toned copies after prolonged storage.

It is an object of this invention to obviate the necessity for immediate conversion of an imaged offset master produced by electrostatic technique, thereby to extend the latitude with respect to imaging the master and conversion of the imaged master, without concern for any time limitation.

Thus it is an object of this invention to provide a process wherein the imaged master can be converted after a considerable period of storage after imaging to produce an imaged offset master capable of yielding multiple copies without tone or scum and of good copy quality.

It has been found, in accordance with the practice of this invention, that copy quality is not sacrificed by use of an imaged offset master in which conversion has been carried out long after imaging if such conversion is carried out on an imaged surface containing a residual organic solvent which is incompatible with the aqueous medium of the conversion solution thereby to pose a barrier to the penetration of the imaged areas during conversion. The presence of such residual solvent on the imaged surface during conversion can be effected by pre-wetting the surface with liquid solvent composition immediately prior to treatment for conversion.

A large number of liquid organic solvents can be used from within the group having the following specifications. The pre-wet solvent should be formulated entirely or at least partially with a solvent having a boiling point preferably within the range of 280°–360° F. The solvent should not have a Kauri-Butanol (KB) value so high as to be detrimental to the photoconductive coating as by solution or swelling of the binder. For this purpose, it is undesirable to make use of a solvent system having a KB value above 50 and it is preferred to make use of a solvent system having a KB value below 50. It is desirable to avoid the selection of a highly flammable solvent or a high boiling, viscous, slow drying solvent, since the latter solvents may be retained in the non-imaged areas and preclude conversion and thus cause toning in the copy produced by the imaged master.

Suitable solvents for use in a pre-wetting solvent system, in accordance with the practice of this invention, may be selected of aliphatic hydrocarbon solvents having a carbon length greater than 8 and preferably within the range of $C_{12}$ to $C_{18}$. When measured from the standpoint of boiling point, it is desirable to make use of a solvent having a boiling point within the range of 280°–360° F. Representative of suitable solvents that may be used are decane, dodecane, hexadecane, octadecane and mixtures thereof, and commercial solvents such as mineral spirits and the Isopars marketed by Humble Oil Company, such as Isopar G, Isopar H; Magie Oil Solvent 590 (Magie Bros. Oil Co.), or mixtures of such aliphatic hydrocarbon solvents, which may contain a small amount (0.5 to 5% by weight) of a dicarboxylic acid ester, such as a mixture of Isopar G with 1% by weight of dibutyl phthalate.

Aromatic solvents are undesirable because of their high solvency characteristics by comparison with the long chain aliphatic hydrocarbon solvents but as much as 10% by weight, and preferably less than 5% by weight, aromatic solvents in admixture with aliphatic hydrocarbon solvents would not be harmful.

The surface of the imaged offset master can be wet with the pre-wet solvent in any number of ways well known to the skilled in the art. The imaged master can be continuously advanced for immersion in a bath of the solvent system, followed by passage between squeegee rollers for removal of excess solvent. The solvent can be sprayed onto the surface, or wash coated, or wiped onto the surface by a brush or pad wet with the solvent.

A time lapse can occur between solvent pre-wetting and treatment with the conversion solution but the time lapse should not be so great as to allow all of the pre-wetting solvent to volatilize off so that a residual amount will remain to minimize and preferably prevent undermining of the image by the conversion solution. It is preferred to effect conversion within a matter of a few minutes and preferably immediately after wetting the imaged surface with the prewetting solvent.

In the absence of residual solvent, over-conversion usually occurs when the master is treated with the conversion solution long after the master has been imaged, so that the image, particularly in the large black areas, will not accept a continuous film of offset ink, resulting in copy of poor quality.

Having described the basic concepts of this invention, illustration will hereinafter be made with reference to a specific example.

EXAMPLE 1

An electrophotographic master, formed of a high wet strength base paper, provided with a photoconductive coating of a photoconductive zinc oxide in a binder formed of a mixture of polystyrene and polyacrylate, was first provided with an overall electrostatic charge and then exposed to a light pattern to cause the charge to be dissipated from the light exposed areas while being retained to form a latent electrostatic image in the unexposed areas. The exposed plate was then developed with a liquid developer formulated of finely divided hydrophobic toner particles to form the ink receptive, water repellent image on the photoconductive surface.

After storage for several days, the imaged plate was pre-wet by passage through a bath of Isopar G and then through a pair of squeegee rollers for the removal of excess solvent.

After pre-wetting and while the imaged surface still retained residual solvent, the master was converted by immersing in a bath of conversion solution, followed by passage through a pair of squeegee rolls to remove excess. Suitable conversion solutions are described in the aforementioned U.S. Pat. Nos. 3,672,885 and 3,661,598, as represented by the following compositions, in per cent by weight:

(A)

2.0 potassium ferrocyanide
8.0 monobasic ammonium phosphate
0.1 disodium ethylene diamine tetraacetate
1.0 potassium sulfite
88.9 water (B)

2.0 potassium ferrocyanide
8.0 monobasic ammonium phosphate
0.5 potassium sulfite
89.5 water (C)

1.5 potassium ferrocyanide
6.0 monobasic ammonium phosphate
0.1 disodium ethylene diamine tetraacetate
1.5 sodium sulfite
90.9 water (D)

8.0 monobasic ammonium phosphate
2.0 potassium ferrocyanide
15.0 glycerol
74.9 deionized water
0.1 disodium ethylenediamine tetraacetate The plate was then mounted on a lithographic press and multiple copies of good quality were immediately produced. The quality of the impressions was greatly improved by comparison with the same plate processed in the same way but without pre-wetting with the aliphatic hydrocarbon solvent. In the absence of pre-wetting, blinding of the image was clearly evident in the copy that was produced.

In the example described, photoconductive coatings formulated of zinc oxide or other photoconductive materials may be employed and instead of a polystyrene - polyacrylate binder, use can be made of an alkyd resin, an organo silicon resin and the like. Similarly, instead of immersion in a bath for conversion, the conversion solution can be wiped onto the surface or applied by a roller, care being taken to prevent such excesses as may cause blinding of the image.

It will be understood that the concepts of this invention will have equal merit in the conversion of imaged offset manners produced on photoconductive coating other than formulated of a zinc oxide - resinous binder, such as, for example, photoconductive surfaces of other organic or inorganic photoconductive materials in which use is still made of an organic binder component wherein treatment is required to effect conversion of the non-imaged areas from one that is ink receptive and water repellent to one that is ink repellent and water receptive without deleterious effect on the ink receptive, water repellent hydrophobic image that has been formed.

While the invention has been described with reference to the treatment in the preparation of an offset master imaged by electrostatic technique, it will be understood that the concepts described will have application to masters other than that produced by electrostatic technique but wherein the lithographic surface contains an organophilic component which requires treatment with a conversion solution to render the non-imaged portions hydrophilic, ink repellent and water receptive.

It will be understood that changes may be made in the details of formulation and operation without departing from the spirit of the invention, especially as defined in the following claims.

I claim:

1. In the preparation of an electrostatic offset master for use in the production of multiple copies by lithographic technique in which the non-imaged portion of an imaged master is water repellent and hydrophobic and must be converted to a hydrophilic, ink repellent, water receptive portion by treatment with a conversion composition before use of the imaged master for the production of copy by lithographic technique, the improvement which renders possible the storage of imaged masters for future use in the production of multiple copies without deterioration of copy quality comprising the step of wetting the imaged surface of the master with an organic solvent having a KB value below 50 immediately prior to conversion whereby residual solvent remains on the imaged areas as a barrier against the conversion composition to preclude over-conversion and subsequent blinding of the imaged areas with the deterioration of copy quality during subsequent use of the treated master in the production of copies.

2. The preparation as claimed in claim 1 in which the solvent system for pre-wetting the surface is formed principally of an aliphatic hydrocarbon.

3. The preparation as claimed in claim 1 in which the pre-wetting solvent has a boiling point within the range of 280°-360° F.

4. The preparation as claimed in claim 2, in which the aliphatic hydrocarbon has at least 8 carbon atoms.

5. The preparation as claimed in claim 2 in which the aliphatic hydrocarbon is a $C_{10}$ to $C_{18}$ hydrocarbon.

6. The preparation as claimed in claim 2 in which the solvent system contains less than 10% by weight of an aromatic solvent.

* * * * *

UNITED STATES PATENT OFFICE

CERTIFICATE OF CORRECTION

Patent No. 4,007,046 Dated February 8, 1977

Inventor(s) George M. Ort

It is certified that error appears in the above-identified patent and that said Letters Patent are hereby corrected as shown below:

Column 4, line 14, "manners" should read -- masters --.

Signed and Sealed this

*Sixth* Day of *September 1977*

[SEAL]

*Attest:*

RUTH C. MASON
*Attesting Officer*

LUTRELLE F. PARKER
*Acting Commissioner of Patents and Trademarks*